United States Patent
Park et al.

(10) Patent No.: US 8,926,124 B2
(45) Date of Patent: Jan. 6, 2015

(54) SIDE LIGHT APPARATUS OF CHIP MOUNTER AND LIGHT APPARATUS USING THE SIDE LIGHT APPARATUS

(71) Applicant: Samsung Techwin Co., Ltd., Changwon-si (KR)

(72) Inventors: Jae Hyun Park, Changwon-si (KR); Jong Eok Ban, Changwon-si (KR)

(73) Assignee: Samsung Techwin Co., Ltd., Changwon (KR)

( * ) Notice: Subject to any disclaimer, the term of this patent is extended or adjusted under 35 U.S.C. 154(b) by 115 days.

(21) Appl. No.: 13/796,852

(22) Filed: Mar. 12, 2013

(65) Prior Publication Data

US 2013/0250571 A1 Sep. 26, 2013

(30) Foreign Application Priority Data

Mar. 21, 2012 (KR) ........................ 10-2012-0028977

(51) Int. Cl.
- *F21V 1/00* (2006.01)
- *F21V 7/00* (2006.01)
- *H05K 13/04* (2006.01)

(52) U.S. Cl.
CPC .......... *F21V 7/0066* (2013.01); *H05K 13/0413* (2013.01)
USPC ......... 362/235; 362/33; 362/249.02; 362/341

(58) Field of Classification Search
USPC .......... 362/249.02, 33, 235, 341; 250/559.46, 250/223; 356/239.4
See application file for complete search history.

(56) References Cited

U.S. PATENT DOCUMENTS

| | | | | |
|---|---|---|---|---|
| 4,651,257 A | * | 3/1987 | Gehly | 362/33 |
| 6,122,048 A | * | 9/2000 | Cochran et al. | 356/239.4 |
| 6,207,946 B1 | * | 3/2001 | Jusoh et al. | 250/208.1 |
| 7,656,520 B2 | * | 2/2010 | Cohn et al. | 356/237.2 |
| 7,809,461 B2 | * | 10/2010 | Noda et al. | 700/121 |
| 8,292,804 B2 | * | 10/2012 | Marka et al. | 600/249 |
| 8,342,710 B2 | * | 1/2013 | Rahbar-Dehghan | 362/249.02 |
| 8,353,616 B2 | * | 1/2013 | Cennini et al. | 362/619 |
| 2003/0231494 A1 | * | 12/2003 | Shimokawa et al. | 362/245 |
| 2010/0142208 A1 | * | 6/2010 | Kokado et al. | 362/296.07 |
| 2014/0146531 A1 | * | 5/2014 | Ng et al. | 362/231 |

FOREIGN PATENT DOCUMENTS

| | | |
|---|---|---|
| JP | 9181495 A | 7/1997 |
| JP | 2008205226 A | 9/2008 |
| KR | 1020060019677 A | 3/2006 |
| KR | 1020060104378 A | 10/2006 |
| KR | 1020110085459 A | 7/2011 |

* cited by examiner

*Primary Examiner* — Ali Alavi
(74) *Attorney, Agent, or Firm* — Sughrue Mion, PLLC (57) ABSTRACT

Provided are a light apparatus of a chip mounter which emits light to sides of a plurality of parts picked up by a plurality of nozzles of a chip mounter, the light apparatus including: at least one light module including a plurality of sloping portions each of which includes a plurality of slopes, wherein a slope of the plurality of slopes includes a light source emitting light to a side of a first part picked up by a first nozzle among the plurality of nozzles of the chip mounter.

20 Claims, 5 Drawing Sheets

SIDE LIGHT APPARATUS OF CHIP MOUNTER AND LIGHT APPARATUS USING THE SIDE LIGHT APPARATUS

CROSS REFERENCE TO RELATED APPLICATIONS

This application claims priority from Korean Patent Application No. 10-2012-0028977 filed on Mar. 21, 2012 in the Korean Intellectual Property Office, the disclosure of which is incorporated herein by reference in its entirety.

BACKGROUND

1. Field

Apparatuses consistent with exemplary embodiments relate to a light apparatus of a chip mounter, and more particularly, to a side light apparatus of a chip mounter, in which each light source emits light to a side surface of not a spindle or nozzle located directly in front thereof but a spindle or nozzle located obliquely thereto in order to provide optimal lighting in a narrow space.

2. Description of the Related Art

With the development of electronic and communication technology, various electronic devices are becoming smaller and lighter. Accordingly, it is essential to make electronic parts (such as semiconductor chips) embedded in the various electronic devices highly integrated and ultra-small.

Small electronic parts are mounted on a printed circuit board (PCB) by a part mounter such as a chip mounter. There are thousands of types of electronic parts that can be mounted on a PCB by a chip mounter. Due to the high integration density and ultra-small size of such electronic parts, it is required to develop inspection and measurement technology for determining whether the electronic parts have been picked up and mounted on a PCB accurately.

To this end, various functions for ensuring the part-mounting quality of a chip mounter are being implemented. In particular, various methods of inspecting the picked-up state of a part to find a possible defect state in advance and enable accurate mounting are being implemented. These methods are broadly divided into two types: one is methods using pneumatic pressure and the other is methods using images.

The methods using pneumatic pressure suffer from a high frequency of false defects due to the state of nozzles, whether parts have been picked up by the nozzles, and the instability of reference pneumatic pressure. Therefore, the methods using images are preferred. In a related art method using images, an image capture device is placed directly under a nozzle to capture an image of the nozzle and determines whether a part has actually been picked up by the nozzle using the captured image of the nozzle. To clearly capture the image of the part, light is projected onto the part.

To accurately recognize edge lines of parts, part mounting equipment mostly emits light from sides of the parts. In particular, to recognize parts with round or sphere edges (not sharp edges), the part mounting equipment forms a circular or square shape around a focus at which a part is to be recognized and emits light to the part, thereby revealing edges of the part.

Figure 1A:
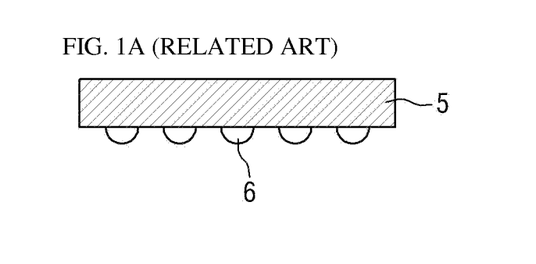
FIG. 1A is a diagram illustrating an example part picked up by a chip mounter.
Figure 1B:
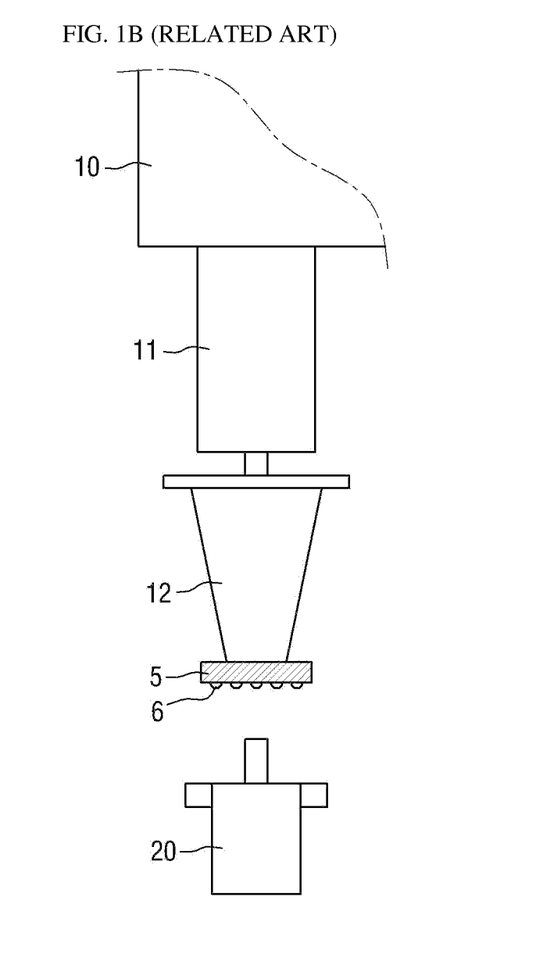
FIG. 1B is a diagram illustrating a conventional chip mounter which captures an image of a part picked up by a nozzle using a camera.
Figure 1C:
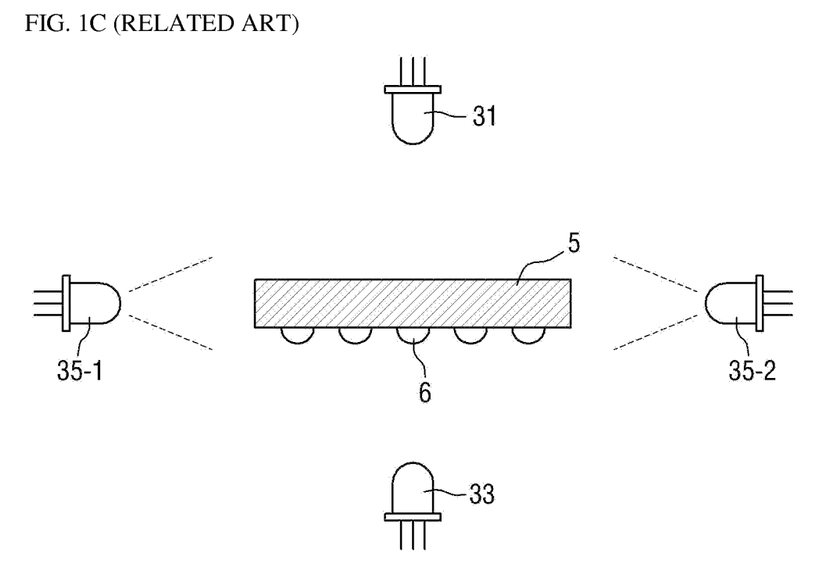
FIG. 1C is a diagram illustrating a conventional light apparatus which emits light to a picked-up part.
Figure 1D:
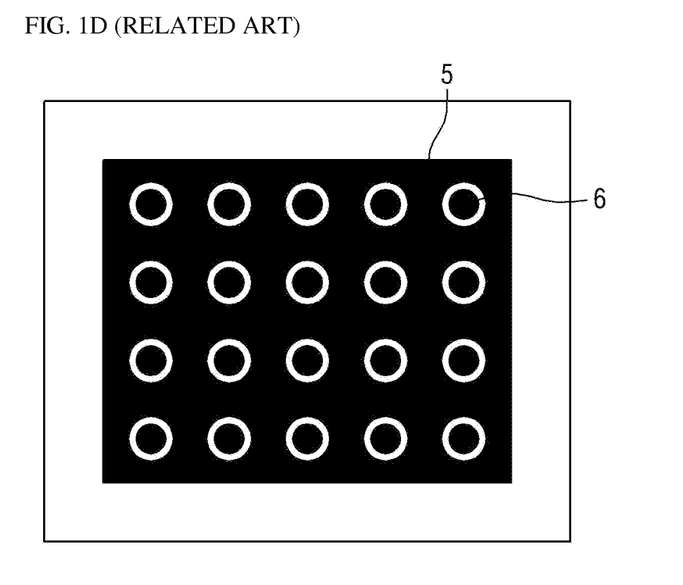
FIG. 1D shows an image of a part captured by the camera.

FIG. 1A is a diagram illustrating an example part picked up by a chip mounter. FIG. 1B is a diagram illustrating a related art chip mounter which captures an image of a part picked up by a nozzle using a camera. FIG. 1C is a diagram illustrating a related art light apparatus which emits light to a picked-up part. FIG. 1D shows an image of a part captured by the camera.

An ultra-small part such as a flipchip does not have leads but has a plurality of protrusions called "balls." Referring to FIG. 1A, a part 5 includes a plurality of balls 6. The part 5 is picked up by a chip mounter and mounted on a PCB.

Referring to FIG. 1B, a head 10 of the chip mounter includes one or more nozzles 12 which pick up parts 5. The head 10 may be circular or square. To pick up the parts 5, the head 10 may move vertically and horizontally while rotating. The nozzles 12 may be arranged at regular intervals in the head 10, supported respectively by spindles 11, and connected to the head 10. A camera 20 is placed on a side of or under the head 10 and captures an image of a side surface or a bottom surface of a part 5 and a spindle 11. Then, the camera 20 analyzes the captured image of the part 5 and obtains information about the length, width, twisted angle and position of the part 5.

After the part 5 is picked up, light should be projected not only onto a top or bottom surface of the part 5 but also to side surfaces of the part 5. Only then can balls 6 located on the bottom surface of the part 5 be clearly "vision-recognized," and thus edges of the part 5 can be recognized clearly. Here, "vision recognition" is to capture and obtain an image of the part 5 using the camera 20 or display an image of the part 5 seen through a lens. Vision recognition is a concept corresponding to the recognition of an object with human eyes.

Therefore, for accurate recognition of edge lines of the part 5, light is projected not only onto the top and bottom surfaces of the part 5 but also onto the side surfaces of the part 5. Referring to FIG. 1C, a top light source 31 and a bottom light source 33 are placed above and under the part 5 to emit light to the top and bottom surfaces of the part 5. In addition, side light sources 35-1 and 35-2 are located on left and right sides of the part 5 to emit light to both side surfaces of the part 5, respectively. Accordingly, not only the edges of the part 5 but also the balls 6 of the part 5 can be recognized accurately.

Referring to FIG. 1D, when the part 5 is located at the focus of the camera 20, if light is projected onto the side surfaces of the part 5, an image in which the balls 6 of the part 5 look like donuts can be obtained. Also, the presence or absence of the balls 6 of the part 5 can be identified in the image.

To increase the speed of part mounting equipment such as a chip mounter and reduce the weight of the chip mounter, the gap between spindles 11 of a head 10 of the chip mounter is being reduced, and more spindles 11 are being arranged in an outer region of the head 10. In this structure, however, side lights cannot be arranged in a row or a circular shape due to the limited space in which the side lights for accurately recognizing the edges of parts 5 are installed.

For example, if the side lights are arranged in a row, the size of a region where the parts 5 are to be mounted may be reduced. In addition, if one recognition device (e.g., a camera) recognizes each part 5 of the head 10 one by one, there is no problem with light uniformity. However, if the recognition device recognizes two or more parts 5, a part 5 on the left or right side of a spindle 11 at each end of the head 10, that is, the outermost part 5 may appear dark due to the interference between the side lights.

SUMMARY

One or more exemplary embodiments provide a side light apparatus of a chip mounter, the light apparatus including a plurality of light sources and capable of providing optimal lighting in a narrow space to parts picked up by a plurality of nozzles of the chip mounter while each light source of the light apparatus emits light to a side of not a part located directly in front thereof but a part next to the part located directly in front thereof.

One or more exemplary embodiments also provide a light apparatus of a chip mounter which can recognize edges of parts and obtain image information of balls of each part accurately since emitted light is reflected by a pair of mirrors installed at both ends of the light apparatus to enter outermost ones of parts picked by spindles of the chip mounter.

However, the exemplary embodiments described herein do not restrict the inventive concept thereto.

According to an aspect of an exemplary embodiment, there is provided a light apparatus to emit light to sides of a plurality of parts picked up by a plurality of nozzles of a chip mounter, respectively, the light apparatus including: at least one light module including a plurality of sloping portions each of which includes a plurality of slopes, wherein a slope of the plurality of slopes includes a light source emitting light to a side of a first part picked up by a first nozzle among the plurality of nozzles of the chip mounter.

The light apparatus may further include a mirror, wherein the light module includes another at least one sloping portion disposed around at the mirror, and a slope of the other at least one sloping portion comprises a light source emitting light to the mirror which reflects the light incident on the mirror to a side of a second part picked up by a second nozzle among the plurality of nozzles of the chip mounter located around at the mirror.

In the light apparatus, the first nozzle may be located second-closest to the light source emitting the light to the side of the first part, among the plurality of nozzles, and faces a slope of a sloping portion of the light module which comprises the light source emitting the light to the side of the first part.

In the light apparatus, an additional light source may be disposed between two neighboring sloping portions located closest to the first nozzle, among the plurality of sloping portions, and emits light to the side of the first part picked up by the first nozzle.

The light sources included in two slopes, of the two neighboring sloping portions, facing each other may emit light to parts, among the plurality of parts, picked up by two nozzles, respectively, right next to the first nozzle.

The light source may emit the light to the side of the first part at an angle of 30 to 60 degrees with respect to a lengthwise direction of the light module.

A color of the light emitted to the side of the first part may be identical or similar to a surface color of the light module.

DESCRIPTION OF THE DRAWINGS

The above and other aspects and features of the inventive concept will become more apparent by describing in detail exemplary embodiments thereof with reference to the attached drawings, in which.

DETAILED DESCRIPTION OF THE EXEMPLARY EMBODIMENTS

The inventive concept will now be described more fully hereinafter with reference to the accompanying drawings, in which exemplary embodiments of the inventive concept are shown. This inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

The inventive concept will now be described more fully with reference to the accompanying drawings, in which exemplary embodiments of the invention are shown.

Figure 2:
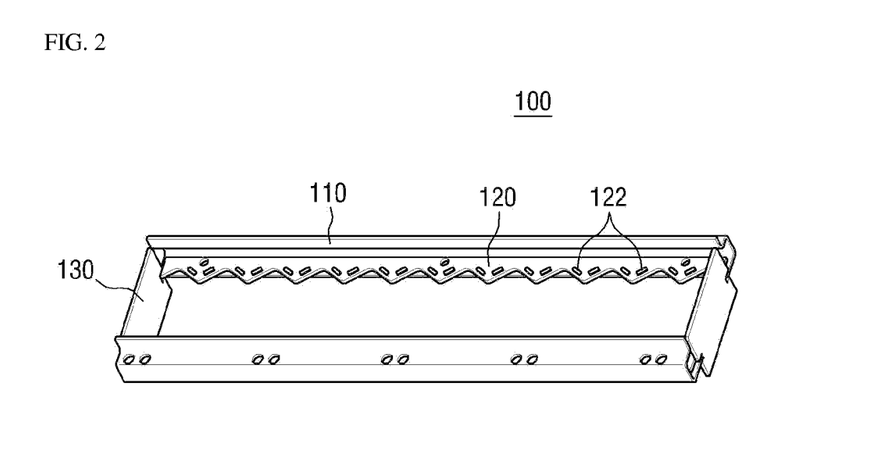
FIG. 2 is a perspective view of a side light apparatus of a chip mounter according to an exemplary embodiment.
Figure 3:
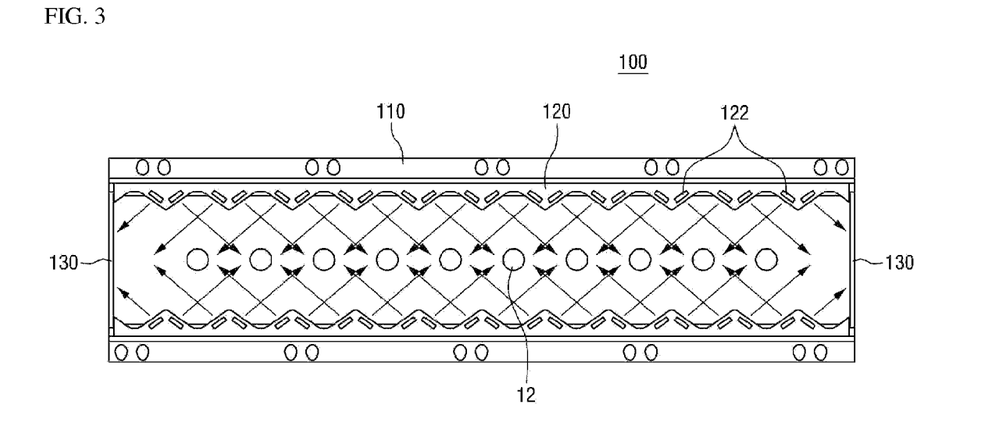
FIG. 3 is a diagram illustrating directions of light emitted from the side light apparatus of FIG. 1 to nozzles of the chip mounter, according to an exemplary embodiment.
Figure 4:
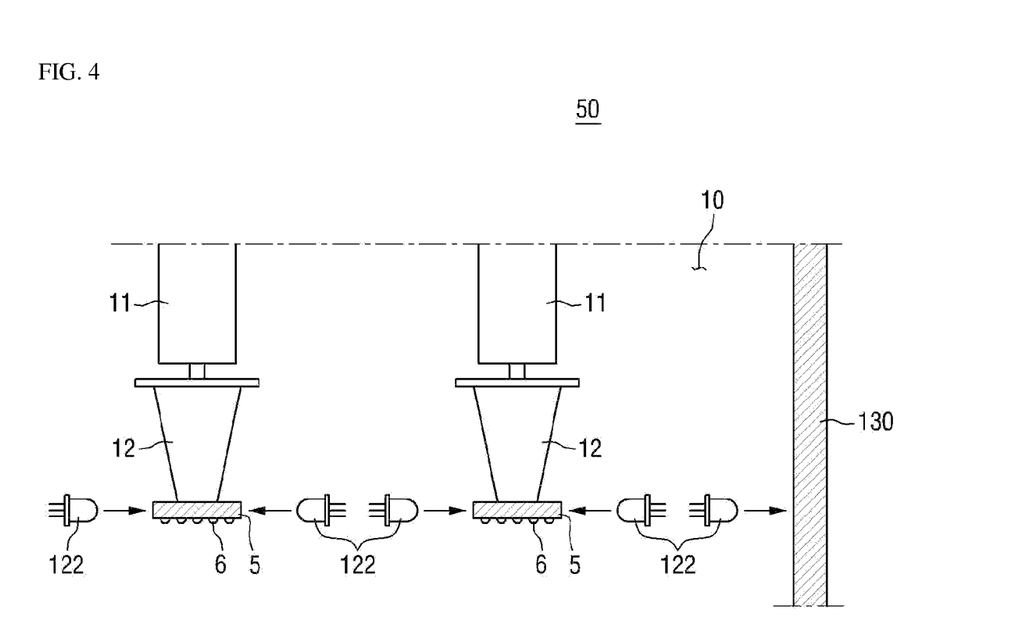
FIG. 4 is a diagram illustrating the side light apparatus of FIG. 1 which emits light to parts picked up by the chip mounter, according to an exemplary embodiment.

FIG. 2 is a perspective view of a side light apparatus 100 for the chip mounter shown in FIG. 1B, according to an exemplary embodiment. FIG. 3 is a diagram illustrating directions of light emitted from the side light apparatus 100 of FIG. 2 to the nozzles 12 of the chip mounter. Here, the directions of the light emitted from the side light apparatus 100 are perpendicular to a direction of vertical movement of the spindles 11 and the nozzles 12 of the chip mounter. FIG. 4 is a diagram illustrating a lateral view of the side light apparatus 100 of FIG. 1 which emits light to parts 5 picked up by the chip mounter.

The side light apparatus 100 of the chip mounter emits light to sides of the parts 5 for recognition of the parts 5 in the chip mounter. The side light apparatus 100 may include a frame 110, a pair of side light modules 120 which face each other, and a pair of mirrors 130 which face each other. Since FIG. 2 is a perspective view of the side light apparatus 100, only one of the side light modules 120 is shown as being disposed along with one lengthwise side of the frame 110. The other side light module 120 is not shown in FIG. 2 since it is disposed behind the other lengthwise side of the frame 110 in FIG. 2.

The frame 110 serves as a housing which houses the side light modules 120 and the mirrors 130. When the spindles 11 and the nozzles 12 of the chip mounter shown in FIG. 1B moves inside the frame 110, light is provided to the parts 5 picked up by the nozzles 12 using the side light modules 120 and the mirrors 130.

The side light modules 120 may be located at both sides and inside the frame 110, respectively. The side light modules 120 may be disposed along the two lengthwise directions of the frame 110, respectively, and have a plurality of saw-tooth portions 121 connected to one another. At least one light source 122 is disposed at each slope of a saw-tooth portion 121 and emits light to a side surface of one of the parts 5 picked up by the nozzles 12 of the chip mounter.

That is, a surface of each side light module 120 extends in a lengthwise direction and is saw-toothed, and at least one light source 122 is disposed at each slope of a saw-tooth portion 121 of each side light module 120 to provide light. Accordingly, each light source 122 included in each side light module 120 does not emit light to a part 5 picked up by a nozzle 12 located closest to the each light source 122. Instead, each light source 122 emits light to a part 5 picked up by a nozzle 12 located second-closest to the each light source 122 among the plurality of nozzles 12 and facing a slope of a saw-tooth portion 121 where the each light source 122 is disposed.

Therefore, the side light modules 120 emit light to the side surfaces of the parts 5 not perpendicularly but at a predetermined angle with respect to the lengthwise direction of each side light module 120. The predetermined angle may be 30 to 60 degrees, preferably but not necessarily, 45 degrees due to the saw-tooth portions 121 of each side light module 120.

The light sources 122 are included in the side light modules 120 and emit light to the nozzles 12 included in the head 10 of the chip mounter and to the side surfaces of the parts 5 picked up by the nozzles 12. For example, the light sources 122 may be light-emitting diode (LED) devices. The LED devices used as the light sources 122 may be side-view LEDs. The side-view LEDs may be installed in the side light modules 120 and may emit light from a slope of each saw-tooth portion 121 at an angle of 90 degrees.

A surface color of each side light module 120 in which one or more light sources 122 are located may be linked to a color of light emitted from the light sources 122. That is, when the light sources 122 emit red light, each side light module 120 or a reflective member (not shown) attached to a top plate of the side light module 120 may be red or similar colors. For example, when the light sources 122 emit white light, each side light module 120 or the reflective member attached to the top plate of the side light module 120 may be white, yellow, or red.

As described above, two side light modules 120 face each other where each side light module 120 is saw-toothed. Further, at least one light source 122 is located at each slope of a saw-tooth portion 121 of each side light module 120. Therefore, the light sources 122 emit light in directions that cross each other, thereby making side edges of the parts 5 clearly visible. Accordingly, parts with a circular (not square) shape can be recognized accurately, and circular balls included in each part can also be recognized accurately.

The mirrors 130 may be located at both sides of the frame 110 where the side light modules 120 are not located. Accordingly, the mirrors 130 and the side light modules 120 may form a space with a rectangular cross section. Light emitted from light sources 122 located at both ends of each side light module 120 may be reflected by the mirrors 130 to enter the parts 5 picked up by nozzles 12 at both ends of the chip mounter.

That is, the mirrors 130 are installed at left and right ends of the side light apparatus 100 of the chip mounter to reflect light, emitted from light sources 122 and incident on the mirrors 130, to the side surfaces of the parts 5 picked up by nozzles 12 at both ends of the chip mounter. Accordingly, the light can be provided to the side surfaces of the parts 5 picked up by the nozzles 12 at both ends of the chip mounter where light generally fails to reach. The provided light makes side edges of the parts 5 more visible.

Referring to FIGS. 3 and 4, the side light apparatus 100 of the chip mounter emits light to the side surfaces of the nozzles 12 from four directions. Thus, the side edges of the parts 5 picked up by the nozzles 12 can be observed clearly. In addition, light emitted from light sources 122 at both ends of each side light module 120 is reflected by the mirrors 130 to enter the parts 5 picked up by outermost nozzles 12 located at both ends of the chip mounter. Therefore, the side edges of the parts 5 picked up by the nozzles 12 at both ends of the chip mounter can be observed clearly.

When the side light apparatus 100 of the chip mounter is configured as described above with reference to FIGS. 2 through 4, more light sources 122 can be installed in the same area. This enables a reduction in the distance between the spindles 11 or between the nozzles 12. Accordingly, more spindles 11 and/or more nozzles 12 can be installed in the same area of the head 10.

Figure 5:
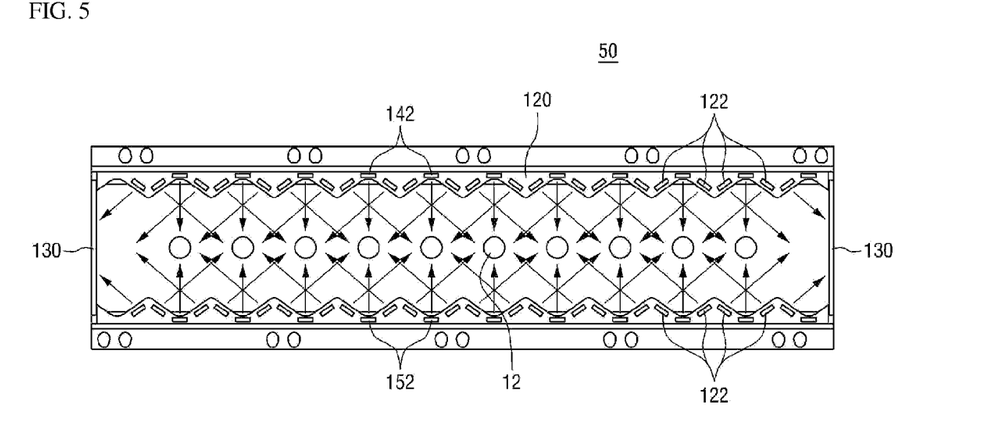
FIG. 5 is a diagram illustrating the schematic configuration of a light apparatus of a chip mounter according to another exemplary embodiment

FIG. 5 is a diagram illustrating a schematic configuration of a light apparatus 50 of a chip mounter according to another exemplary embodiment.

The above-described side light apparatus 100 in reference to FIGS. 2-4 can be expanded to the light apparatus 50 of the chip mounter.

Compared to the side light apparatus 100, the light apparatus 50 includes additional light sources 142, 152 emitting light to the side surfaces of the parts 5 for recognition of the parts 5 in the chip mounter. Each of the light sources 142 is disposed between two neighboring saw-tooth portions 121 of one side light module 120, and each of the light sources 152 is disposed between two neighboring saw-tooth portions 121 of the other side light module 120. Thus, each of the light sources 142, 152 emits light to a side surface of a part 5 picked up by a nozzle 12 located closest to the each of the light sources 142, 152 among the plurality of nozzles 12. Here, the side light modules 120 and the mirrors 130 play the same roles as the side light modules 120 and the mirrors 130 of the above-described side light apparatus 100 of the chip mounter.

LED devices may also be used as the light sources 142 and 152. The number of light sources 142 or 152 included in each of the side light modules 120 may be equal to the number of nozzles 12 installed in the head 10 of the chip mounter. However, it is obvious to those of ordinary skill in the art that the present embodiment does not limit the inventive concept.

The side light modules 120 emit light to the side surfaces of the parts 5 and may be provided in a pair as discussed above. When the side light modules 120 are provided in a pair, they may be, but are not limited to, symmetrical to each other.

As described above, a side of each side light module 120 is saw-toothed, and at least one light source 122 is disposed at each slope of each saw-tooth portion 121 and emits light to a side surface of one of the parts 5 at a predetermined angle with respect to the lengthwise direction of each side light module 120. The predetermined angle may be 30 to 60 degrees, preferably but not necessarily, 45 degrees.

Referring to FIG. 5, the light apparatus 50 of the chip mounter emits light to a part 5 picked up by one nozzle 12 from at least six directions. A light source 142 disposed between two neighboring sub-modules 121 of one side light module 120 emits light to a side surface of a part 5 located closest to the light source 142. Here, this part 5 may be located directly in front of the light source 142. Also, a light source 152 disposed between two neighboring sub-modules 121 of the other side light module 120 emits light to an opposite side surface of the part 5. Since the light apparatus 50 includes these light sources 142, 152 in addition to the light sources 122, the parts 5 picked up by the nozzles 12 except the nozzles 12 located at both ends of the side light module 120 are illuminated by light from six directions. Thus, edge lines of each of the parts 5 can be recognized more accurately.

If the light sources 142, 152 and 122 have the same luminous intensity, light emitted to the side surfaces of a part 5 from the light sources 142, 152 may be more intense than light emitted from the light sources 122 because the light sources 142, 152 are disposed more close to the part 5 than the light sources 122 emitting light to the part 5. For this reason, the light sources 142 and 152 may be placed further away from the part 5 than the light sources 122, so that the part 5 can receive light of the same intensity from any direction, according to an exemplary embodiment.

The luminous intensities of the light sources 142, 152 and 122 can be adjusted by using different electrical powers or LED ranks, according to an exemplary embodiment.

The mirrors 130 may be installed at both sides of the light apparatus 50 where the side light modules 120 are not located. As described above, light emitted from light sources 122 located at both ends of each side light module 120 may be reflected by the mirrors 130 to enter the parts 5 picked up and picked up by nozzles 12 at both ends of the chip mounter.

Referring to FIG. 5, the light apparatus 50 of the chip mounter emits light to a part 5 picked up by one nozzle 12 from at least six directions. Also, a nozzle 12 at each end of the chip mounter receives light reflected by a mirror 130 located on a left or right side of the nozzle 12.

Therefore, more light sources 122, 142 and 152 can be installed in the same area of the light apparatus 50 of the chip mounter. Accordingly, more spindles 11 can be installed in the same area of a head 10, and the light apparatus 50 of the chip mounter can be designed to be slim.

According to the above exemplary embodiments, optimal side lighting can be provided in a narrow space. Therefore, whether a part has been picked up accurately can be determined regardless of the shape of the part.

In addition, light can be projected onto a part in a narrow space using mirrors. Therefore, edges of the part can be recognized, and position information of balls of the part can be obtained. Accordingly, the part and the balls can be recognized accurately and quickly.

Furthermore, since a light apparatus can be designed to provide optimal lighting in a narrow space, costs can be saved, and the productivity of a chip mounter can be improved.

Thus far, various exemplary embodiments have been described in reference to the drawings. However, these embodiments are provided only for illustrative purposes without limiting the inventive concept. For example, the number of the side light modules 120 in FIGS. 2, 3 and 5 is not limited to two, and instead, only one side light apparatus 120 may be disposed along one side of the frame 110 of the side light apparatus 100 or 50. Also, the number of the light sources 122 disposed at each slope of a saw-tooth portion 121 is not limited to one, and the number of the light sources 142 or 152 disposed between two neighboring saw-tooth portions 121 is not limited to one. Two or more light sources 122, 142 or 152 may be disposed at corresponding portions of the side light apparatus 120. Also, the number of the mirrors 130 is not limited to two, and instead, only one mirror 130 may be provided at one end of the side light apparatus 120. Also, the saw-tooth portions 121 may take a different form not being limited only to the saw-tooth form. Thus, those skilled in the art will appreciate that various modifications, additions and substitutions are possible without departing from the spirit and scope of the inventive concept as defined by the accompanying claims.

What is claimed is:

1. A light apparatus to emit light to sides of a plurality of parts picked up by a plurality of nozzles of a chip mounter, respectively, the light apparatus comprising:
   at least one light module comprising a plurality of sloping portions each of which comprises a plurality of slopes,
   wherein a slope of the plurality of slopes comprises a light source emitting light to a side of a first part picked up by a first nozzle among the plurality of nozzles of the chip mounter.

2. The light apparatus of claim 1, further comprising:
   a mirror,
   wherein the light module comprises another at least one sloping portion disposed around at the mirror, and
   wherein a slope of the other at least one sloping portion comprises a light source emitting light to the mirror which reflects the light incident on the mirror to a side of a second part picked up by a second nozzle among the plurality of nozzles of the chip mounter located around at the mirror.

3. The light apparatus of claim 2, wherein the first nozzle is located second-closest to the light source emitting the light to the side of the first part, among the plurality of nozzles, and faces a slope of a sloping portion of the light module which comprises the light source emitting the light to the side of the first part.

4. The light apparatus of claim 3, wherein an additional light source is disposed between two neighboring sloping portions located closest to the first nozzle, among the plurality of sloping portions, and emits light to the side of the first part picked up by the first nozzle.

5. The light apparatus of claim 4, wherein the light source included in the slope of each sloping portion and the additional light source have the same luminous intensity.

6. The light apparatus of claim 5, wherein the additional light source is disposed further away from the first part than light sources included in the two neighboring sloping portions.

7. The light apparatus of claim 6, wherein the light sources included in two slopes, of the two neighboring sloping portions, facing each other emit light to parts, among the plurality of parts, picked up by two nozzles, respectively, right next to the first nozzle.

8. The light apparatus of claim 4, wherein the light source emits the light to the side of the first part at an angle of 30 to 60 degrees with respect to a lengthwise direction of the light module.

9. The light apparatus of claim 8, wherein the light source comprises a light-emitting diode (LED).

10. The light apparatus of claim 8, wherein a color of the light emitted to the side of the first part is identical or similar to a surface color of the light module.

11. The light apparatus of claim 1, wherein the first nozzle is located second-closest to the light source emitting the light to the side of the first part, among the plurality of nozzles, and faces a slope of a sloping portion of the light module which comprises the light source emitting the light to the side of the first part.

12. The light apparatus of claim 11, wherein an additional light source is disposed between two neighboring sloping portions located closest to the first nozzle, among the plurality of sloping portions, and emits light to the side of the first part picked up by the first nozzle.

13. The light apparatus of claim 12, wherein the light source included in the slope of each sloping portion and the additional light source have the same luminous intensity.

14. The light apparatus of claim 13, wherein the additional light source is disposed further away from the first part than light sources included in the two neighboring sloping portions.

15. The light apparatus of claim 14, wherein the light sources included in two slopes, of the two neighboring sloping portions, facing each other emit light to parts, among the plurality of parts, picked up by two nozzles, respectively, right next to the first nozzle.

16. The light apparatus of claim 12, wherein the light sources included in two slopes, of the two neighboring sloping portions, facing each other emit light to parts, among the plurality of parts, picked up by two nozzles, respectively, right next to the first nozzle.

17. The light apparatus of claim 12, wherein the light source emits the light to the side of the first part at an angle of 30 to 60 degrees with respect to a lengthwise direction of the light module.

18. The light apparatus of claim 1, wherein the at least one light module comprises two light modules which face each other and each of which comprises a plurality of sloping portions each of which comprises a plurality of slopes,
wherein a slope of the plurality of slopes comprises a light source emitting light to a side of a first part picked up by a first nozzle among the plurality of nozzles of the chip mounter, and
wherein each sloping portion forms a saw-tooth having two sloping portions.

19. The light apparatus of claim 18, further comprising:
at two mirrors installed at each end of the light apparatus and facing each other,
wherein the light module comprises another at least one sloping portion, disposed around at the one end of the light module, a slope of which comprises an end light source emitting light to the mirror which reflects the light from the end light source to a side of a second part picked up by a second nozzle among the plurality of nozzles of the chip mounter located around at the one end of the light apparatus.

20. The light apparatus of claim 18, wherein an additional light source is disposed between two neighboring sloping portions located closest to the first nozzle, among the plurality of sloping portions, and emits light to the side of the first part picked up by the first nozzle.

* * * * *